United States Patent [19]

Helms

[11] Patent Number: 4,706,208

[45] Date of Patent: Nov. 10, 1987

[54] TECHNIQUE FOR THE OPERATIONAL LIFE TEST OF MICROPROCESSORS

[75] Inventor: Howard D. Helms, Brookside, N.J.

[73] Assignee: American Telephone and Telegraph Company, AT&T Bell Laboratories, Murray Hill, N.J.

[21] Appl. No.: 772,157

[22] Filed: Sep. 3, 1985

[51] Int. Cl.[4] .................. G06F 11/30; G05B 23/02
[52] U.S. Cl. .................................. 364/580; 364/579; 371/16; 371/18
[58] Field of Search ............... 364/579, 580; 371/16, 371/18, 20, 21

[56] References Cited

U.S. PATENT DOCUMENTS

| | | | |
|---|---|---|---|
| 3,969,618 | 7/1976 | Strubel et al. | 371/20 |
| 4,125,763 | 11/1978 | Drabing et al. | 371/20 |
| 4,371,952 | 2/1983 | Schuck | 371/16 |
| 4,402,055 | 8/1983 | Lloyd et al. | 364/579 |
| 4,495,622 | 1/1985 | Charruau | 371/20 |
| 4,581,738 | 4/1986 | Miller et al. | 371/16 |

OTHER PUBLICATIONS

Nutburn, Proceedings of Microtest, Brighton, England, Apr. 2-5, 1979, pp. 52-65.
Farnholtz, The W. E. Engineer, vol. XXV, No. 3, Fall 1981, pp. 3-9.
Belt et al., New Electronics, vol. 14, No. 22, Nov. 10, 1981, pp. 44, 49.
Jensen et al., "Burn-In", John Wiley & Sons, 1982, pp. 1, 47-75.
Brown, New Electronics, vol. 14, No. 22, Nov. 10, 1981, pp. 78-80.
Colman et al., Southcon/82 Conf. Rec., Mar. 23-25, 1982, Orlando, Fla., pp. 20/2.1-20/2.5.

Primary Examiner—Felix D. Gruber
Attorney, Agent, or Firm—Erwin W. Pfeifle

[57] ABSTRACT

The present invention relates to an Operational Life Test (OLT) or "burn-in" technique for testing microprocessors. In accordance with the present invention, an OLT chamber is provided wherein many Evaluation Boards are mounted within racks in a frame in the chamber, each Board being designed for separately exercising its associated microprocessor integrated circuit (IC). During the OLT or burn-in procedure, each Evaluation Boards runs its own internally stored diagnostics, simultaneously with other Boards, to exercise the associated microprocessor ICs while the power to the Boards and the environment within the chamber is appropriately cycled to simulate system testing, installation or normal customer use. During the OLT procedure, each Board periodically reports the status of the associated microprocessor IC to circuitry such as a computer outside the chamber in order to provide a means for determining and recording any failure of a Board.

11 Claims, 6 Drawing Figures

FIG. 3

| STEP | BOARD_1 | BOARD_2 | BOARD_3 |
|------|---------|---------|---------|
| | EXAMPLE OF PROTOCOL FOR PROPAGATING "I'M WELL" SIGNALS | | |
| 1 | Board 1 computes its diagnostics | Board 2 computes its diagnostics | Board 3 computes its diagnostics |
| 2 | After a period of time Board 1 initiates an "I'M WELL" signal by sending an interrupt to board 2 | Board 2 is interrupted | " |
| 3 | Board 1 receives board 2's acknowledgment | Board 2 acknowledgment board 1's interupt | " |
| 4 | Board 1 sends board 2 the number 0 | Board 2 receives this number | " |
| 5 | Board 1 resumes computing its diagnostics | Board 2 adds one to the number | " |
| 6 | Board 1 computes its diagnostics | Board 2 sends an interrupt to Board 3 | Board 3 is interrupted |
| 7 | " | Board 2 receives board 3's acknowledgment | Board 3 acknowledgment board 2's interupt |
| 8 | " | Board 2 sends board 3 the incremented No. | Board 3 receives this number |
| 9 | " | Board 2 resumes computing its diagnostics | Board 3 adds one to the number |
| 10-13 | " | Board 2 computes its diagnostics | Board 3 performs board 2's steps 6 through 9 |

TECHNIQUE FOR THE OPERATIONAL LIFE TEST OF MICROPROCESSORS

TECHNICAL FIELD

The present invention relates to an Operational Life Test (OLT) or "burn-in" technique for microprocessors. More particularly, an OLT chamber is provided which mounts many Evaluation Boards in a rack within the chamber, each Board being designed for separately exercising its associated microprocessor integrated circuit (IC). During the OLT or burn-in procedure, the Evaluation Boards exercise the associated microprocessor ICs and report the status of each microprocessor IC to circuitry such as a computer outside the chamber.

DESCRIPTION OF THE PRIOR ART

Operational Life Tests (OLTs) provide measures of the early-life reliability of components. An OLT achieves this by continually exercising a component, such as an integrated circuit (IC), while frequently testing the circuits of the component simultaneously with the circuits of other corresponding components, to determine whether the component is continuing to function. OLT also includes testing in a chamber whose environment and instrumentation are selectively controlled to simulate use by a customer.

Operational life testing of semiconductor devices was discussed in the article by D. F. Farnholtz in *The Western Electric Engineer,* Vol. XXV, No. 3, Fall 1981 at pages 2-9. As disclosed in the article, in OLT, many semiconductor devices are mounted in trays which are interconnected for operation in either series or parallel depending on the device code under test. While the devices are being electrically tested, the thermal chamber is cycled between selected temperatures to simulate temperature cycling experienced by the circuits during system testing, installation, and normal use. It has been found that with OLT, infant mortality can be detected, which advantageously avoids early failures occurring in the field. Additionally, a reliability problem can be dealt with by component "burn-in", which is performed under accelerated conditions, such as increased temperature, to attempt to induce as many as possible of the potential infant mortality failures while the product is in the factory.

The concept of burn-in is a method for screening out early failures in a group of components or systems prior to their introduction into general service by a customer. The burn-in process involves time as an important factor since the elements to be tested are monitored for failure either continuously or at a predefined time sequence. When one is reasonably sure that the weak items have failed, the burn-in is stopped, leaving the remaining items in a state of reliability. One of the major problems associated with burn-in is to decide exactly how long the burn-in should continue, balancing appropriately the needs of reliability and the total cost. In this regard see, for example, the book "Burn-In" by F. Jensen et al., John Wiley & Sons, 1982, and especially pages 1 and 47-75.

The instrumentation in a conventional OLT-chamber for a microprocessor IC generally exercises many such ICs with test vectors ordinarily used only for exercising individual ICs. Moreover, these test vectors must enter the ICs at a clock rate in the vicinity of, for example, 10 MHz. More particularly, an MOS IC must be exercised with test vectors so that all of its transistors are stressed with normal voltages. Furthermore, clock rates in the vicinity of the exemplary 10 MHz are needed because modern microprocessors are designed in CMOS, in which power dissipation, which causes self-heating, is approximately proportional to the clock rate. Thus to achieve normal self-heating of the microprocessor, it is necessary to use normal clock-rates. Additionally, it is not generally possible to use lower clock rates while raising the temperature of the chamber to simulate self-heating since self-heating is nonuniform and unpredictable, particularly if the attachment of the chip to the package is defective, e.g., the epoxy adhesive does not fill the space between the chip and the package.

A conventional chamber verifies functionality by comparing the outputs of the ICs with a second set of test vectors. To obtain such a chamber from a supplier typically requires a full year, during which the supplier designs and makes device-test boards separately for each code of IC. The problem, therefore, is to design an OLT chamber which reduces the time of procurement for actual testing.

SUMMARY OF THE INVENTION

The foregoing problem has been solved in accordance with the present invention which relates to an Operational Life Test (OLT) technique for microprocessors. More particularly, an OLT chamber is provided for life testing microprocessors wherein a separate single-board microcomputer is used to test the associated microprocessor integrated circuits (ICs) concurrent with the testing of other single board microcomputers and their associated microprocessor ICs in the chamber.

It is an aspect of the present invention that each Evaluation Board runs its own internally stored diagnostics simultaneously with the other Boards being tested in the chamber while the power to the Boards and the chamber environment is selectively controlled. Periodically the Boards exchange information with a computer system associated with the chamber, which computer system records the failure of any Board.

Other and further aspects of the present invention will become apparent during the course of the following description and by reference to the accompanying drawings.

BRIEF DESCRIPTION OF THE DRAWINGS

Referring now to the drawings in which like numerals represent like parts in the several views:

FIG. 3 is a chart of an exemplary protocol for propagating "I'm well" signals in a serial connection of a plurality of Evaluation Boards of FIG. 1;

DETAILED DESCRIPTION

In accordance with the present invention, an alternative to conventional Operational Life Test (OLT) chambers is achieved using single-board microcomputers, also known as Evaluation Boards, commonly used for software development. For purposes of explanation, a specific code single-board microcomputer and associated microprocessor of AT&T will be discussed hereinafter. It is to be understood that such discussion is only for purposes of exposition and not for purposes of limitation of the present invention to such coded single-board microcomputer or microprocessor, since the technique of the present invention can be similarly applied to other codes and manufacturer's single-board microcomputers and microprocessors.

Figure 1:
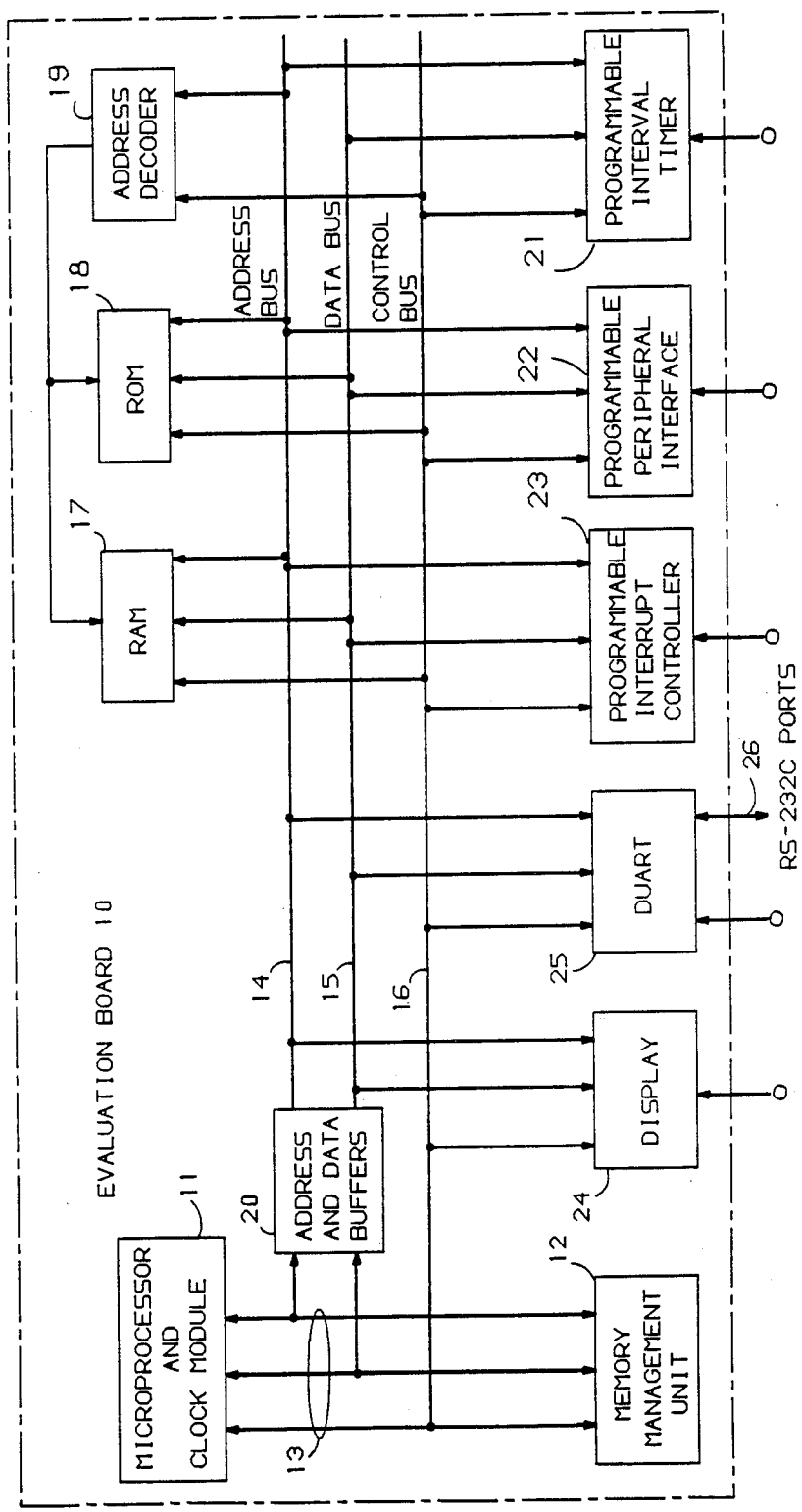
FIG. 1 is a block diagram of an exemplary Evaluation Board for use in the Operational Life Test (OLT) chamber of the present invention.

A typical single-board microcomputer for a microprocessor is, for example, the AT&T code WE321EB Evaluation Board 10 for testing a WE 32100 code microprocessor where pertinent parts of such board are shown in the block diagram of FIG. 1. The board includes a combination of a predetermined code microprocessor, which is to be tested, and clock module 11; and a Memory Management Unit 12 connected to a bus 13 comprising address, data and control bus sections 14–16, respectively. Evaluation Board 10 also includes a RAM 17 which provides a scratch-pad memory, a ROM 18 which comprises the testing and diagnostics program, and an address decoder 19 for accessing memories 17 and 18 in response to an address being received on the address and control sections 14 and 16, of bus 13 via an address and data buffer 20.

Evaluation Board 10 also is shown as comprising a programmable interval timer 21, a programmable peripheral interface 22, a programmable interrupt controller 23, a display 24 for displaying a predetermined number of digits, and a Dual Universal Asynchronous Receiver and Transmitter (DUART) 25 which is coupled to, for example, two RS-232C serial Input/Output (I/O) ports 26, one for each direction of transmission. Such components are well known in the art. The microprocessor to be tested generally operates at predetermined clock frequencies up to, for example, 10 MHz and uses the clock in module 11 as the clock source.

Figure 2:
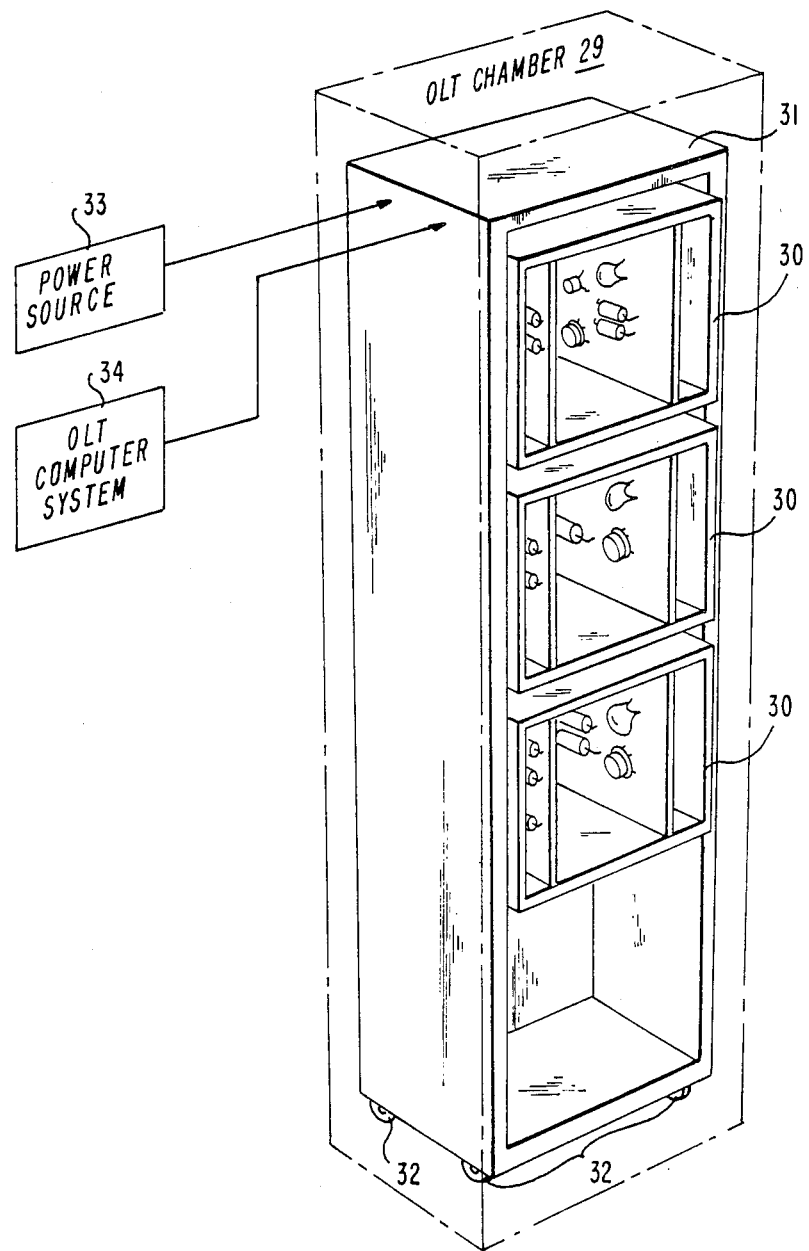
FIG. 2 is a view in perspective of an OLT chamber in accordance with the present invention wherein a plurality of Evaluation Boards are mounted in a frame for simultaneous testing.

In the present OLT chamber 29, a plurality of Evaluation Boards 10 are disposed parallel to each other in each of a plurality of racks or apparatus mountings 30 mounted in a frame 31 as shown in FIG. 2. Frame 31 can include wheels 32 for ease of moving the frame in and out of OLT chamber 29 for testing purposes. Apparatus mountings 30 are well known in the art and generally include guide ramps and mounting plates which are designed to receive and house predetermined circuit boards in a spaced-apart relationship to each other. Typical apparatus mountings are, for example, the standard AT&T FAST ECH ™ hardware units. The plurality of Evaluation Boards 10, after being mounted in apparatus mountings 30 are then interconnected in a predetermined manner in a serial or parallel manner using standard cables, including power leads, with connectors for plugging into the exemplary RS-232C ports 26 of Evaluation Boards 10.

The Evaluation Boards 10, after being placed in racks 30 and then in OLT chamber 29, are supplied with D. C. power from an external power source 33 in a controlled-temperature environment of chamber 29. Evaluation Boards 10 are each capable of running programs (e.g., diagnostics) for verifying that the included microprocessor ICs are functioning properly. Evaluation Boards 10 also are capable of generating error detection signals for transmission to, for example, a Cathode Ray Tube (CRT) display forming part of a separate computer system 34 external to, but associated with, OLT chamber 29. Preferably, the temperature provided in OLT chamber 29 would be less than the maximum temperature for which the ICs are designed, but at least as high as most customer-use temperatures. During testing, the temperature within chamber 29 can, for example, be cycled down to the inlet temperature of the air-conditioning ducts of chamber 29, for example, once per day, and in addition the electrical power could also be turned off a predetermined number of times per day. Such excursions of power and temperature are used to simulate initial use by a customer. During such testing, Evaluation Boards 10 simultaneously run their diagnostics and determine whether the associated microprocessor ICs are functioning properly. Periodically, information is exchanged between Evaluation Boards 10 and the external computer system 34 of OLT chamber 29, which computer system would record the failure of an Evaluation Board 10.

Figure 4:
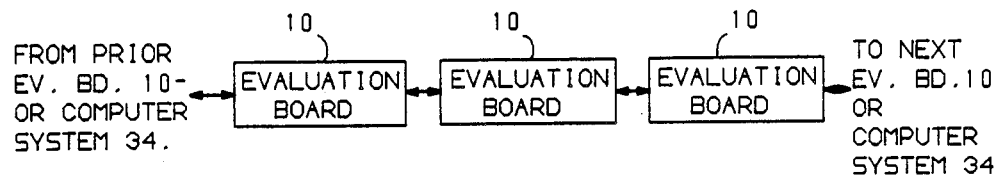
FIG. 4 is a block diagram of the serial connection of a plurality of Evaluation Boards for propagating unidirectional or bidirectional "I'm well" signals in accordance with the protocol of FIG. 3.

The electrical design of OLT chamber 29 must include a technique for verifying that the microprocessor ICs on each Evaluation Board 10 are functioning properly. One technique for accomplishing this is to connect Evaluation Boards 10 to each other and have Boards 10 send "I'm well" signals to the external computer system 34 monitoring the Boards. One method of verifying the proper functioning of the microprocessor ICs under test is by connecting Boards 10 in series as shown in FIG. 4, with one Board 10 connected to another by cabling their RS-232C ports together. The external computer system 34 would terminate one or both ends of this chain.

FIG. 3 shows an exemplary protocol for communication between Evaluation Boards 10 and between the Boards 10 and computer system 34. In step 1 of FIG. 3, a Board 10 runs its diagnostic programs for a predetermined period of time (e.g. 6 minutes). Then the Board would stop running its diagnostic program and would send an interrupt over the exemplary RS-232C link to the next Board 10 nearer the computer system 34 as shown in step 2. This next Board 10 would acknowledge receipt of the interrupt and would accept a number identifying the Board originating this sequence as shown in steps 3 and 4. As step 5 of FIG. 3 shows, the Evaluation Board 10 receiving this number would increment this number by one and would repeat this cycle by interrupting the next Board 10 down the chain. When the last Board 10 in the chain has handed off the number to computer system 34, the computer system uses this number to identify the originating Board 10. Computer system 34 would keep a log of the last time that such an "I'm well" report had been received from each Board 10. If the elapsed time for any Board 10 exceeds a predetermined number (e.g. 6 minutes), computer system 34 would register and record a malfunction of that Board. Such procedure would work equally well for any Board in the chain. The procedure also offers the advantage that the same program could be used in each of Evaluation Boards 10.

With the procedure just described, however, if an Evaluation Board 10 failed, all "I'm well" signals from Boards 10 further away from the computer system 34 would not propagate through the failed Board. If one of the Boards 10 further away then failed, there would be no way to detect such failure until the original failure had been cleared. This problem can be minimized by choosing the number "n" of Evaluation Boards 10 in the chain to be such that the probability "np" of occurrence of a nondetectable failure is small compared to "1", with "p" denoting the probability of failure of a single Board 10. An alternative is to connect computer system 34 to both ends of the chain and to propagate "I'm well" signals in both directions from each Board 10 in the manner found in transmitting signals bidirectionally in present day Local Area Network communication systems. Such procedure will reduce the likelihood of difficulty since the probability of there being two or more failures in the bidirectional chain is approximately $(np)^2/2$, or approximately $np/2$ times as large as the probability of one or more failures in the unidirectional chain. For example, if $np=0.1$, then $(np)^2/2=0.005$; which is a factor of 20 improvement.

Figure 5:
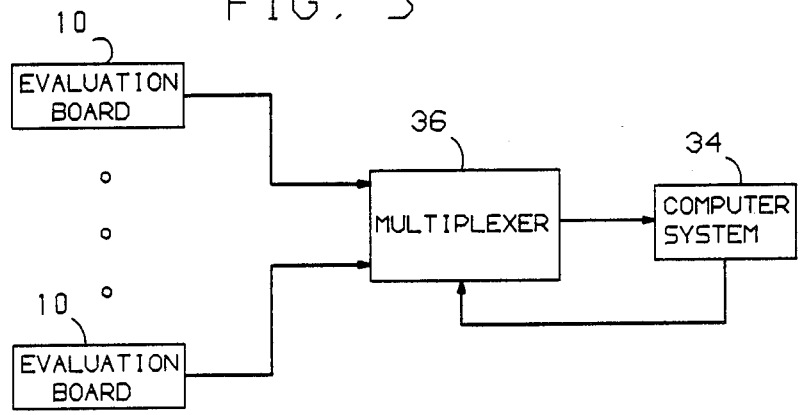
FIG. 5 is a block diagram of individual Evaluation Boards being connected to a multiplexer for delivering "I'm well" signals to the external computer system of the OLT chamber.

An alternative arrangement to the arrangement of FIG. 4 is shown in FIG. 5 wherein each Evaluation Board 10 is connected by its exemplary RS-232C cable to a multiplexer 36 such as a step switch. For greater flexibility, a commercially available multiport controller could be used which is compatible with the cable interface used by Evaluation Boards 10. In such configuration, computer system 34 periodically can order the multiplexer, or step switch, 36 to sequentially advance the path therethrough from one Board 10 to the next. Whenever multiplexer 36 pauses at a Board 10, the computer system 34 interrupts that Board in order for the Board to return a signal indicating that it is still functioning. Then, multiplexer 36 would be advanced to the next Board to repeat this sequence.

Figure 6:
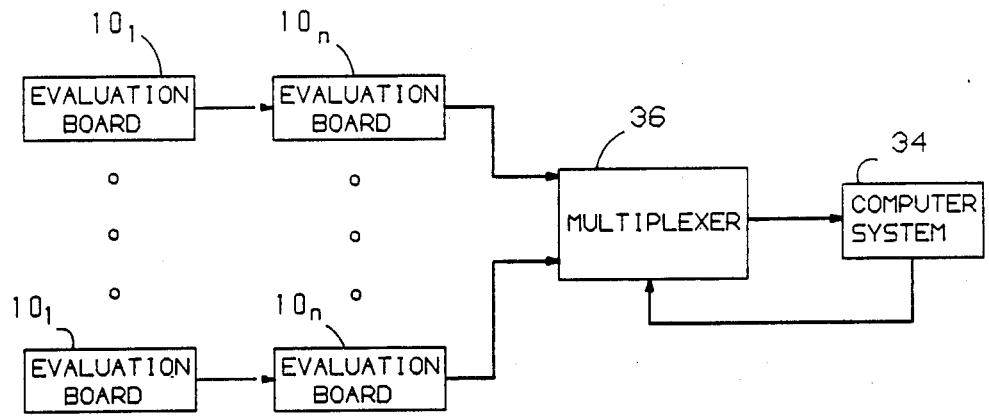
FIG. 6 is a block diagram of a combination of the arrangements of FIGS. 4 and 5 where plural chains of Evaluation Boards are connected to a multiplexer.

The serial path and multiplexer arrangement alternatives of FIGS. 4 and 5 described above can also be combined by connecting a number "m" of Evaluation Boards 10 in series and then connecting a number "n" of such chains of Boards 10 to a multiplexer 36 as shown in FIG. 6. The configuration of FIG. 6 permits the failure probability "mp" to be kept small by making "n" small enough while permitting a large number of "mn" Boards 10 to be monitored by a single computer system 34. It is to be understood that reducing the number of components on each Evaluation Board 10 would lower its cost and increase its reliability. One way of accomplishing this might be to remove as much of RAM 17 as possible. Such removal of part of RAM 17 may, however, require the modification of an existing diagnostics and I/O program that would normally use such removed part of RAM 17. It is also possible in some cases to, for example, use registers included with the microprocessor IC as the scratch-pad memory instead of RAM 17 of FIG. 1. In such case, RAM 17 could be removed entirely. Besides saving the cost of providing a RAM 17 on Evaluation Board 10, it would be possible to operate Evaluation Board 10 autonomously of external computer 34, at least initially. Thus, under control of the ROM 18, Evaluation Board 10 could continually diagnose itself while reporting the results on its Display 24, with Display 24 being monitored visually on a periodic basis.

What is claimed is:

1. A method of performing an Operational Life Test or burn-in of a plurality of microprocessors, the method comprising the steps of:
   (a) mounting a plurality of Evaluation Boards in a spaced-apart relationship to each other, each Evaluation Board comprising a separate microprocessor to be tested and means for storing a diagnostics program for separately exercising the associated microprocessor and transmitting periodic status signals;
   (b) connecting the plurality of Evaluation Boards to a control means for (1) supplying to each of the Evaluation Boards an appropriate power level for energizing the Evaluation Board, and (2) receiving the status signals from each Evaluation Board; and
   (c) causing the plurality of Evaluation Boards to both concurrently exercise the associated microprocessors and periodically transmit the periodic status signals to the control means.

2. A method of performing an Operational Life Test or burn-in of a plurality of microprocessors according to claim 1 wherein the method comprises the further steps of:
   (d) in performing step (a), mounting the plurality of Evaluation Boards within a chamber capable of having its environment selectively changed; and
   (e) in performing step (c) concurrently causing the chamber to selectively change its environment in accordance with a predetermined pattern to simulate testing, installation or normal use of the microprocessor.

3. A method of performing an Operational Life Test or burn-in of a plurality of microprocessors according to claim 1 or 2, the method comprising the further step of:
   (f) in performing step (b), connecting the plurality of Evaluation Boards in series and at least one end of the series chain of Evaluation Boards to the control means.

4. A method of performing an Operational Life Test or burn-in of a plurality of microprocessors according to claim 3, the method comprising the further step of:
   (g) in performing step (c) causing each Evaluation Board to periodically transmits a current status signal indicating that the microprocessor is still operating to the next Evaluation Board in the series chain for relay to the means for receiving status signals.

5. A method of performing an Operational Life Test or burn-in of a plurality of microprocessors according to claim 1 or 2, the method comprising the further steps of:
   (f) in performing step (b), connecting the plurality of Evaluation Boards in parallel to separate inputs of a multiplexing means, with the output of said multiplexing means being connected to the control means; and
   (g) in performing step (c) causing the multiplexing means to sequentially access each Evaluation Board in order to transmit its status signal to the control means.

6. A method of performing an Operational Life Test or burn-in of a plurality of microprocessors according to claim 1 or 2, the method comprising the further steps of: (f) in performing step (b), connecting separate subgroups of the plurality of Evaluation Boards in series and connecting each of the separate subgroups of Evaluation Boards to a separate input of a multiplexing means, the output of said multiplexing means being connected to the control means; and (g) in performing step (c) causing the multiplexing means to sequentially access each subgroup of Evaluation Boards in order to permit the transmission of the separate status signal associated with each Evaluation Board of the subgroup to the control means.

7. Apparatus for performing Operational Life Tests or burn-in of microprocessors, the apparatus comprising:
 a plurality of Evaluation Boards, each Evaluation Board comprising an associated microprocessor to be tested and means for storing a diagnostics program for separately exercising the associated microprocessor and transmitting periodic status signals;
 means for mounting the plurality of Evaluation Boards in a predetermined spaced-apart relationship to each another; and
 control means connected to the plurality of Evaluation Boards for both (a) generating control signals to cause the plurality of Evaluation Boards to concurrently run their stored diagnostics programs and exercise the associated microprocessors, and (b) reading the status signals generated by each of the Evaluation Boards at predetermined periods of time during the test to permit said control means to record a failure of any Board.

8. Apparatus according to claim 7 wherein the apparatus further comprises:
 an environmental chamber for housing the mounting means containing the plurality of Evaluation Boards, said environmental chamber being capable of selectively having its environment changed to simulate testing, installation or normal use conditions of the microprocessors during the time when the Evaluation Boards are being separately exercised by the included diagnostic programs.

9. Apparatus according to claim 7 or 8 wherein the plurality of Evaluation Boards are connected in a serial chain, and at least one end of the serial chain of Evaluation Boards is connected to said control means, each Evaluation Board transmitting its status signals at predetermined periods of time to the next Evaluation Board in the serial chain for relay to the control means.

10. Apparatus according to claim 7 or 8 wherein the apparatus further comprises
 a multiplexing means comprising a plurality of input terminals and an output terminal, the multiplexing means being responsive to control signals for sequentially connecting each of the input terminals to the output terminal; and
 the plurality of Evaluation Boards are each connected to separate input terminals of the multiplexing means, with the output terminal of the multiplexing means being connected to an input of the control means; and
 the control means includes means for generating control signals to the multiplexing means for causing the multiplexing means to sequentially connect each of the plurality of Evaluation Boards to the control means and transmit their status signals.

11. Apparatus according to claim 7 or 8 wherein the apparatus further comprises:
 a multiplexing means comprising a plurality of input terminals and an output terminal, the multiplexing means being responsive to control signals for sequentially connecting each of the input terminals to the output terminal; and
 the plurality of Evaluation Boards are divided into a lesser plurality of subgroups of Evaluation Boards with each subgroup of Evaluation Boards being connected in a serial chain and to a separate input terminal of the multiplexing means, the output terminal of the multiplexing means being connected to an input of the control means; and
 the control means includes means for generating control signals to the multiplexing means for causing the multiplexing means to sequentially connect each of the plurality of subgroups to the control means for transmitting the status signals of each of the Evaluation Board of the subgroup to the control means.

* * * * *